（12) United States Patent
Chen et al.

(10) Patent No.: US 10,310,390 B2
(45) Date of Patent: Jun. 4, 2019

(54) WAFER TABLE CHUCK HAVING A PARTICLE RECESS

(71) Applicant: Taiwan Semiconductor Manufacturing Co., Ltd., Hsin-Chu (TW)

(72) Inventors: Yung-Hsiang Chen, Hsinchu County (TW); Chung-Yi Ho, Kaohsiung (TW); David Zhou, Shanghai (CN)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/687,908

(22) Filed: Aug. 28, 2017

(65) Prior Publication Data

US 2019/0049849 A1    Feb. 14, 2019

(30) Foreign Application Priority Data

Aug. 10, 2017   (CN) .......................... 2017 1 0680417

(51) Int. Cl.
| | |
|---|---|
| G03F 7/20 | (2006.01) |
| G03F 1/42 | (2012.01) |
| G03F 9/00 | (2006.01) |
| G03F 7/26 | (2006.01) |
| G03F 7/16 | (2006.01) |

(52) U.S. Cl.
CPC ................ G03F 7/707 (2013.01); G03F 1/42 (2013.01); G03F 7/16 (2013.01); G03F 7/2002 (2013.01); G03F 7/26 (2013.01); G03F 9/7073 (2013.01)

(58) Field of Classification Search
CPC ....... G02B 7/008; G02B 5/0891; G03F 7/707; G03F 1/42; G03F 7/16; G03F 7/2002; G03F 7/26; G03F 9/7073
See application file for complete search history.

(56) References Cited

U.S. PATENT DOCUMENTS

| | | | | |
|---|---|---|---|---|
| 5,374,829 A | * | 12/1994 | Sakamoto | ............... C30B 25/12 250/453.11 |
| 5,563,683 A | * | 10/1996 | Kamiya | .................. G03F 7/707 355/53 |
| 5,923,408 A | * | 7/1999 | Takabayashi | ........... G03F 7/707 269/21 |
| 6,032,715 A | * | 3/2000 | Ohkubo | ................ B25B 11/005 156/538 |
| 6,307,620 B1 | * | 10/2001 | Takabayashi | ........... G03F 7/707 355/53 |

(Continued)

*Primary Examiner* — Deoram Persaud
(74) *Attorney, Agent, or Firm* — Eschweiler & Potashnik, LLC

(57) ABSTRACT

An apparatus for a chuck having particle recesses is provided. In some embodiments, the chuck includes a plurality of impressions and a particle recess. The impressions of the plurality of impressions are laterally spaced and extend into the chuck from a top surface of the chuck to a base surface of the chuck. The base surface of the chuck defines bottom surfaces respectively of the impressions and is spaced between the top surface of the chuck and a bottom surface of the chuck. The particle recess extends in to the chuck from the top surface of the chuck to a location spaced between the base surface of the chuck and the bottom surface of the chuck. In particular, the particle recess is configured to underlie a workpiece alignment mark of a workpiece.

20 Claims, 9 Drawing Sheets

(56) References Cited

U.S. PATENT DOCUMENTS

| | | | | |
|---|---|---|---|---|
| 6,664,549 | B2* | 12/2003 | Kobayashi | B25B 11/005 |
| | | | | 250/440.11 |
| 7,646,581 | B2* | 1/2010 | Sasaki | C23C 14/505 |
| | | | | 361/234 |
| 9,786,538 | B2* | 10/2017 | Momikura | H01L 21/6875 |
| 2010/0141910 | A1* | 6/2010 | Van Der Heijden | G03B 27/52 |
| | | | | 355/30 |
| 2011/0037824 | A1* | 2/2011 | Usami | G03F 7/704 |
| | | | | 347/237 |

* cited by examiner

WAFER TABLE CHUCK HAVING A PARTICLE RECESS

REFERENCE TO RELATED APPLICATION

This Application claims priority to Chinese Application number 201710680417.0 filed on Aug. 10, 2017, the contents of which are hereby incorporated by reference in their entirety.

BACKGROUND

An integrated circuit (IC) may be manufactured by repeatedly forming patterns on a workpiece using lithography. Lithography is a process for transferring a pattern from a transfer layer (e.g., a reticle) to a workpiece, and is repeatedly performed during the manufacture of an IC. In order for an IC to function correctly, it's important to minimize alignment error between the workpiece and the transfer layer. Contributors to alignment error include, for example, distortion of the workpiece and a tool calibration.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
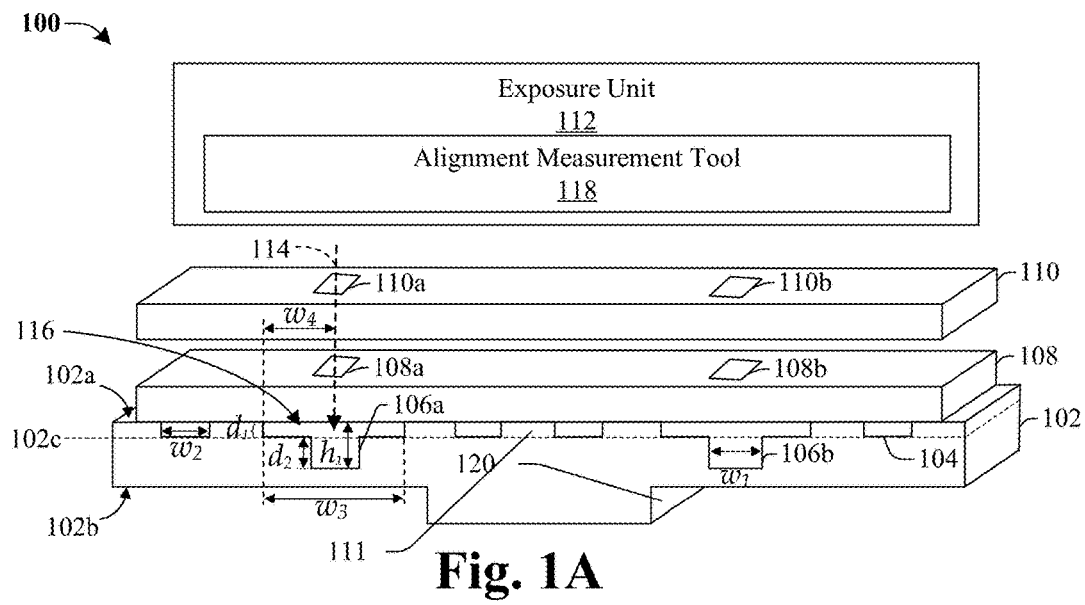
FIG. 1A illustrates a perspective view of some embodiments of a lithography system with a chuck having particle recesses.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may likewise be interpreted accordingly. Even more, the terms "first", "second", "third", "fourth", and the like are merely generic identifiers and, as such, may be interchanged in various embodiments. For example, while an element (e.g., an alignment mark) may be referred to as a "first" element in some embodiments, the element may be referred to as a "second" element in other embodiments.

Integrated circuits (ICs) are normally made through multiple process steps in a semiconductor workpiece fabrication facility, where process steps place patterned layers on a workpiece. In order for the ICs to operate correctly, these patterned layers must be aligned accurately with each other. Misalignment between the patterned layers may cause short circuits or connection failures which significantly impact device yield.

Misalignment may occur when patterned layers are laterally offset in the x and/or y direction. The patterned layers may also become misaligned when the patterned layers are vertically offset from each other at an angle, referred to as a theta error. Misalignment can also present as a magnification error. These alignment errors may occur during an initial phase of fabrication or during the manufacturing of integrated circuit devices. With the increase in complexity of integrated circuits, the alignment of the patterned layers becomes more and more important and difficult to maintain.

Different processes may be used to create workpieces with different patterns and feature sizes. For example, to manufacture patterns, lithography, x-ray lithography, imprint lithography, photolithography, etc. may be used. In one example, patterns of transparent and opaque areas are formed on surfaces of quartz plates acting as transfer layers (e.g., photomasks, reticles, etc.). An exposure unit passes radiation through a transfer layer to form an image of the transfer pattern. The image is focused and reduced by a lens, and projected onto the surface of the workpiece that is coated with a photosensitive material called photoresist. Often, the image is "stepped" across the workpiece by moving the workpiece on a chuck (i.e., wafer stage). The movement can for example correspond to individual dies on the workpiece, to "imprint" the pattern into the photoresist. After exposure by the exposure unit, the coated workpiece is developed, causing the photoresist to dissolve in certain areas according to the amount of light the areas received during exposure. These areas of photoresist and no photoresist reproduce the pattern of the transfer layer.

During patterning, particles can become trapped between the chuck and the workpiece. For example, particles of the photoresist may become lodged between the chuck and the workpiece causing the workpiece to be vertically offset from the chuck at an angle relative to the height of the particle. This theta error caused by the particle not only adversely affects the workpiece being secured to the chuck, but also the alignment of the overlying layers. For example, the theta error may cause one patterned layer to move or slide relative to another bringing about a misalignment in the x-direction and y-direction. In some embodiments, a lithography process may use focusing systems to locate images of the alignment marks onto the same focal plane. For small features, approximately less than 100 nanometers (nm), imaging the alignment marks in the same focal plane improves resolution. The particle being lodged between the workpiece and chuck may reduce the range of the focal length thereby reducing the focal plane and degrading resolution.

The present disclosure relates to a workpiece table including a chuck having a particle recess. For example, the chuck includes a top surface, a bottom surface, and a base surface between the top surface and the bottom surface. The top surface is separated from the base surface by protrusions defining the top surface, and protruding from the base surface to the top surface. The protrusions are laterally separated from one another to define impressions between the protrusions, where the base surface defines bottom surfaces of the impressions. In some embodiments, the protrusions may be posts, columns, or stanchion. The chuck further includes a particle recess underlying an alignment mark of a workpiece and having a bottom surface spaced below the base surface. Thus, errant particles that become trapped between the chuck and the workpiece, at a point underlying the alignment mark, at least partially settle in the particle recess.

Because patterned layers are arranged relative to one another based on the alignment marks, misalignment errors occurring at an alignment mark can propagate over the entire workpiece rendering most, if not all, of the resulting dies unusable. Thus, these errors are considered non-correctable errors (NCEs). The particle recess advantageously underlies an alignment mark to reduce the effect that a particle trapped under an alignment mark may have. In particular, when a particle is lodged in the particle recess, the chuck and the workpiece are able to remain substantially parallel such the protrusions of the chuck maintain contact with the workpiece.

The dimensions of the particle recess may correspond to a typical particle size used in patterning such as the particle size of the photoresist being used. For example, the dimensions of the particle recess may be approximately the same as the dimension of a particle. Thus, the workpiece remains parallel to the chuck even when the particle is lodged in the particle recess between the workpiece and the chuck. This reduces alignment shift due to defocus. Further, the alignment mark of the chuck can be used to properly align the chuck and the workpiece without the particle causing an alignment error.

With reference to FIG. 1A, some embodiments of a lithography system 100 with a chuck 102 having particle recesses 106a/106b is illustrated. The chuck 102 (i.e., wafer stage) is configured to receive a workpiece 108 (e.g., a wafer). The chuck 102 has a top surface 102a and a bottom surface 102b. An exposure unit 112 forms features on the workpiece 108 while the workpiece 108 is seated on the chuck 102. In particular, the exposure unit 112 forms the features on the workpiece 108 by exposing the workpiece 108 to radiation through a transfer layer 110.

In one embodiment, the transfer layer 110 may be a reticle and the exposure unit 112 may employ photolithography to form features on the workpiece 108. For example, the workpiece 108 is covered with a photosensitive material and seated on the chuck 102. Further, the workpiece 108 is aligned to the transfer layer 110 according to workpiece alignment marks 108a/108b on the workpiece 108 and transfer alignment marks 110a/110b on the transfer layer 110. The workpiece 108 is then repeatedly exposed to radiation patterned by the transfer layer 110 while the workpiece 108 is stepped or moved according to an exposure field layout, thereby transferring a pattern of the transfer layer 110 to exposure fields of the exposure field layout. The workpiece 108 may, for example, be moved by moving the chuck 102, and/or the exposure fields may, for example, correspond to dies.

Misalignment of the chuck 102, the workpiece 108, and the transfer layer 110, can cause features to be inaccurately formed on the workpiece 108. Because a single workpiece 108 may accommodate hundreds of individual dies, misalignment can cause any or all of the dies on the workpiece 108 to be malformed and thus, unusable. Therefore, it is important that the chuck 102, the workpiece 108, and the transfer layer 110 be substantially parallel and aligned according to workpiece alignment marks 108a/108b and the transfer alignment marks 110a/110b.

A theta error caused by a particle becoming lodged between the chuck 102 and the workpiece 108 results in separation the chuck 102 and the workpiece 108. The separation can cause misalignment between the workpiece 108 and the transfer layer 110 such that the workpiece alignment marks 108a/108b and the transfer alignment marks 110a/110b are offset. Accordingly, the chuck 102 includes particle recesses 106a/106b that underlie the workpiece alignment marks 108a/108b and/or the transfer alignment marks 110a/110b. The particle recesses 106a/106b are configured to accommodate a particle that may become trapped between the chuck 102 and the workpiece 108 so that even if a particle does become lodged between the chuck 102 and the workpiece 108, the workpiece 108 and the transfer layer 110 remain aligned, which reduces alignment errors.

The particle recesses 106a/106b have a height, $h_1$, and a width, $w_1$. The height, $h_1$, extends from the top surface 102a to a point between the bottom surface 102b and a base surface 102c. The larger the height, $h_1$, the worse the flatness that can be achieved and the smaller the height, $h_1$, increases the contact area. In some embodiments, the height, $h_1$, is approximately 30 nanometers (nm). As described in more detail hereafter, the base surface 102c is a surface from which a plurality of protrusions 111 (e.g., ribs and/or burls) extend to the top surface 102a. The height, $h_1$, and the width, $w_1$, may be based on a particle size of materials (e.g., liquids and/or gasses) used during fabrication. For example, the height, $h_1$, and the width, $w_1$, may be based on the type of photoresist material being used during fabrication. Further, the particle recesses 106a/106b may, for example, each define a cavity having a topmost boundary at the top surface 102a and a bottommost boundary at a bottom surface of the particle recess, where the bottom surface is spaced below the base surface 102c. The cavity may, for example, be cuboid shaped or cylinder shaped. Further, the only inlet and outlet to the cavity may be, for example, at the topmost boundary, or at or above the top or base surface 102a, 102c of the chuck 102.

While two particle recesses 106a/106b are shown more or fewer particle recesses may be used. In some embodiments, the number of particle recesses in the chuck 102 corresponds to the number of the workpiece alignment marks 108a/108b and/or the number of the transfer alignment marks 110a/110b. Additionally or alternatively, the number of particle recesses 106a/106b in the chuck 102 may be based on the amount of coating materials being used during fabrication or the number of dies being fabricated on the workpiece 108.

The chuck 102 also has a plurality of impressions 104. The plurality of impressions 104 extend into the chuck 102 to a depth, $d_1$, from the top surface 102a of the chuck 102 to the base surface 102c. The plurality of the impressions 104 are laterally separated from one another by protrusions 111 of the chuck 102 that extend from the base surface 102c to the top surface 102a. The protrusions 111 define the top surface 102a of the chuck 102 and may be, for example, burls, line-shaped ribs, or arc-shaped ribs. The impressions 104 may, for example, be spaced so that the impressions 104 are equidistant from one another. An impression of the plurality of impressions 104 has a width, $w_2$. The width, $w_2$, may be 2.5 millimeter (mm). In some embodiments, the width, $w_2$, corresponds to the width, $w_1$, of the particle recesses 106a/106b.

In some embodiments, the particle recesses 106a/106b of the chuck 102 may be directly centered under the workpiece alignment marks 108a/108b and/or the transfer alignment marks 110a/110b. For example, suppose a centerline 114 extends through the particle recesses 106a/106b such that the distances from the centerline 114 to the particle recess sidewalls is equidistant. The centerline 114 may also extend through a center of the workpiece alignment marks 108a/108b and/or the transfer alignment marks 110a/110b.

In addition to underlying the workpiece alignment marks 108a/108b and/or the transfer alignment marks 110a/110b, the particle recesses 106a/106b may be located between and open to adjacent impressions of the plurality of impressions 104. A width, $w_4$, between a center of the alignment mark 108a to the edge of the particle recess 106a may be in a range of approximately 0.9821 to 1.1933 mm. As such, a particle recess and a pair of adjacent openings may define an opening 116 in the top surface 102a of the chuck 102 that has a stepped profile. At the top of the opening 116, the opening 116 has a width, $w_3$ which is the width, $w_1$, of the particle recess plus two times the width, $w_2$, of the impressions 104. At the bottom of the opening 116, the opening 116 has the width, $w_1$, of the particle recess.

The impressions 104 extend into the chuck 102 to a depth, $d_1$, from the top surface 102a, and the base surface 102c of the chuck 102 defines the bottom surfaces of the impressions 104. The particle recesses 106a/106b extend into the chuck 102, beyond the base surface 102c by an additional depth, $d_2$, such that the height $h_1$, of the particle recesses 106a/106b is equal to the depth, $d_1$, plus the additional depth, $d_2$. The additional depth, $d_2$, adds additional space to accommodate a particle thereby reducing the likelihood that an errant particle will induce misalignment and cause NCEs.

In some embodiments, an alignment measurement tool 118 may measure the alignment between the workpiece alignment marks 108a/108b and the transfer alignment marks 110a/110b. Such measurement may, for example, be performed using interferometry, and/or the workpiece alignment marks 108a/108b and the transfer alignment marks 110a/110b may be micro-gratings. Further, the measurements may, for example, be employed for overlay control. While the alignment measurement tool 118 is shown to be a component of the exposure unit 112, the alignment measurement tool 118 may instead be a standalone feature or a component of another device. The chuck 102 may also include a vacuum port 120. The vacuum port 120 is used during fabrication process but does not form a bottom surface of the particle recesses 106a/106b.

Figure 1B:
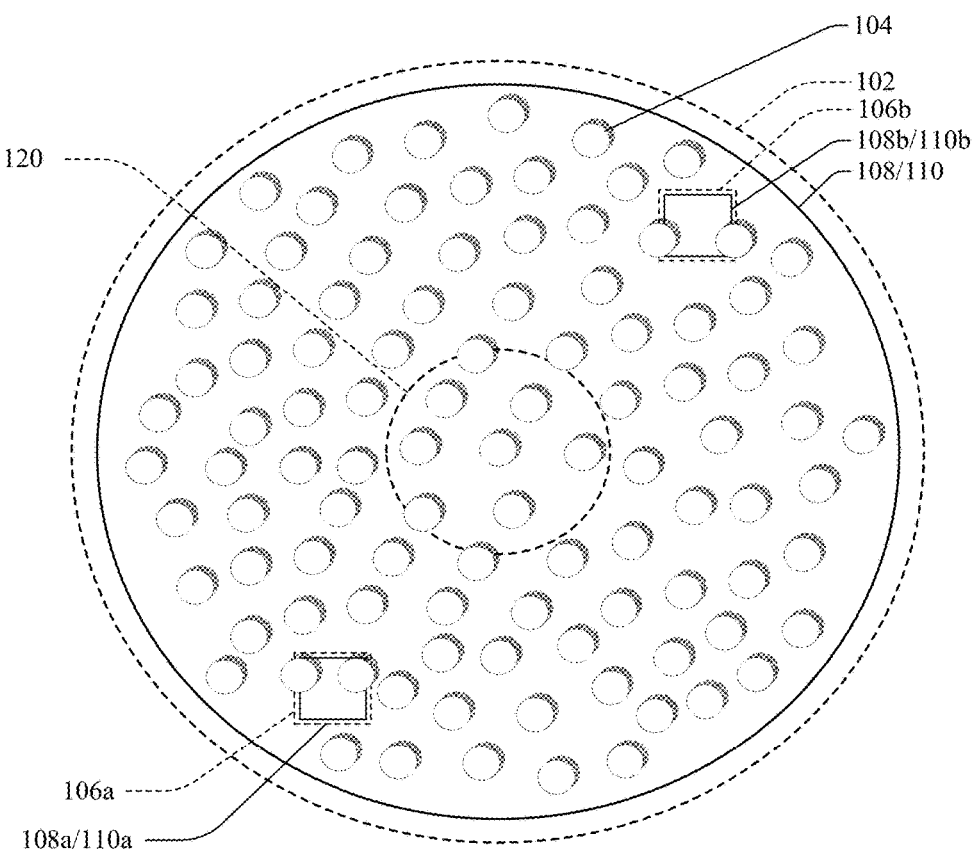
FIG. 1B illustrates a top view of some embodiments of the chuck of FIG. 1A.

FIG. 1B illustrates a top view of some embodiments of a workpiece 108 and a chuck 102 having a particle recess 106a/106b. The plurality of impressions 104 are illustrated as circular depressions in chuck 102. This shape is merely exemplary and the plurality of impressions 104 may be formed as other shapes including, but not limited to, squares, ellipsoids, rhomboids, irregular shapes, etc. Alternatively, the plurality of impressions 104 may be formed on the chuck by depositing material. For example, the plurality of impressions 104 may be the result of forming protrusions on the chuck 102. As shown, the workpiece alignment marks 108a/108b and/or the transfer alignment marks 110a/110b may overlap the plurality of impressions 104.

In some embodiments, the particle recesses 106a/106b exceed the dimensions of the workpiece alignment marks 108a/108b and/or the transfer alignment marks 110a/110b. This may be done to ensure that a particle on the edge of particle recesses 106a/106b do not cause misalignment. Further, in some embodiments, the particle recesses 106a/106b may be offset from the workpiece alignment marks 108a/108b and/or the transfer alignment marks 110a/110b. For example, if particles are more likely to become lodged between the chuck 102 and the workpiece 108 at the perimeter of the workpiece 108, the particle recesses 106a/106b may be offset toward the perimeter of the workpiece 108.

Figure 2A:
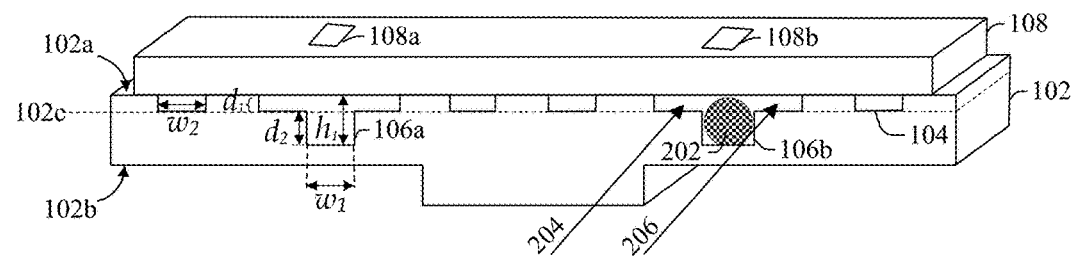
FIGS. 2A and 2B illustrate cross-sectional views of various embodiments of the chuck of FIG. 1A in which a particle is lodged in a particle recess of the chuck.

FIG. 2A illustrates a perspective view of a particle 202 lodged in the particle recess 106b of the chuck 102. The particle 202 settles into the particle recess 106b. In some embodiments the width, $w_1$, of the particle recess 106b may be selected such that the particle 202 is able to make contact with a bottom surface of the particle recess 106b. In some embodiments, the width, $w_1$, of the particle recess 106b may be selected based, at least in part on the diameter of particle 202. In some embodiments (as shown), the particle recess 106b is arranged between adjacent impressions 204, 206 of the plurality of impressions 104. This allows fabrication materials to still move between the chuck 102 and the workpiece 108 along impressions 204, 206.

Figure 2B:
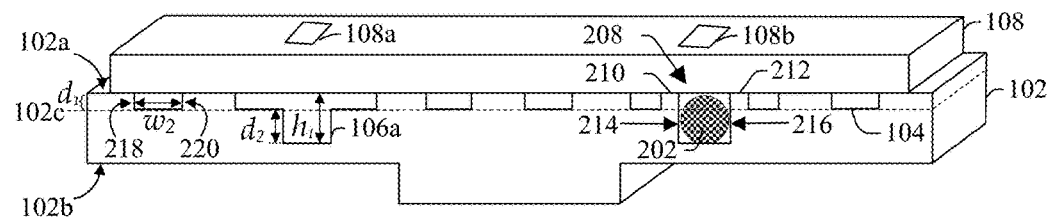

FIG. 2B illustrates a perspective view of a particle 202 lodged in an alternative embodiment of a particle recess 208 of the chuck 102. The particle recess 208 has recess sidewalls 214 and 216 and a protrusion has protrusion sidewalls 218 and 220. Because the plurality of impressions 104 is formed by the protrusions, such as protrusions 210 and 212, and vice versa, the protrusion sidewalls 218 and 220 are also impression sidewalls. In the embodiment shown, the particle recess 208 is framed by protrusions 210 and 212, such that the recess sidewalls 214 and 216 of the particle recess 208 have a height, $h_1$, and extend from the top surface 102a of the chuck 102 to the bottom surface of the particle recess 208. In some embodiments, the recess sidewalls 214 and 216 of the particle recess 208 are coplanar with protrusion sidewalls of adjacent protrusions 210 and 212. In some embodiments, the recess sidewalls 214 and 216 of the particle recess 208 are sloped to guide an errant particle to the bottom surface of the particle recess 208.

Figure 3:
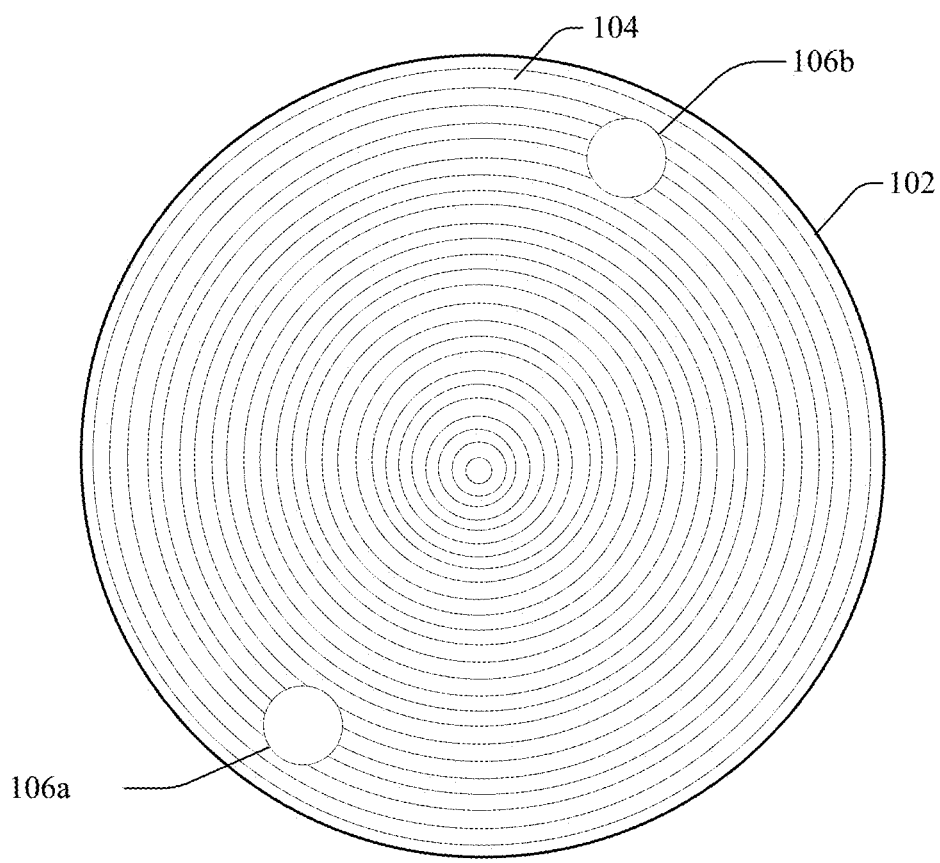
FIG. 3 illustrates a top view of some other embodiments of the chuck of FIG. 1A in which the chuck has trenches and particle recesses.

FIG. 3 illustrates a top view of some embodiments of a chuck 102 in which the impressions 104 are trenches. In some embodiments, the plurality of impressions 104 circumnavigate a center of the chuck 102 and/or are circular. Further, in some embodiments, the plurality of impressions 104 may be a series of ring-shaped trenches radiating outward from a center of the chuck 102.

Figure 4A:
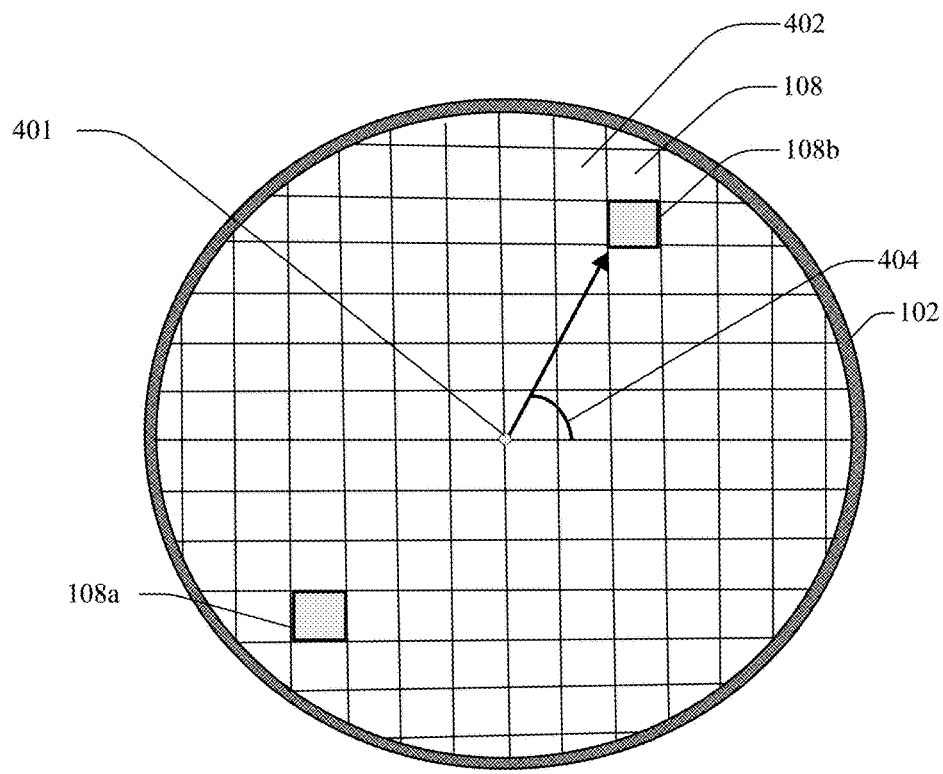
FIG. 4A illustrates a top view of some embodiments of a workpiece having dies and workpiece alignment marks.

FIG. 4A illustrates a top view of a workpiece 108 having a plurality of dies, such as die 402, and workpiece alignment marks 108a/108b for use in conjunction with particle recesses 106a/106b (not shown) on the chuck 102. In some embodiments, the locations of the workpiece alignment marks 108a/108b are based on a two-dimensional Cartesian coordinate system with X and Y dimensions. The X and Y dimensions may, for example, be substantially parallel to a top surface of the workpiece 108. Further, the locations of the workpiece alignment marks 108a/108b may, for example, be defined by x and y coordinates in the X and Y dimensions. For example, the workpiece alignment mark 108b may have the Cartesian coordinates (77.8, 54.5). The locations of the particle recesses 106a/106b on the chuck 102 may also be based on the Cartesian coordinate system to facilitate alignment of the particle recesses 106a/106b and of the workpiece alignment marks 108a/108b. Alternatively, the locations of the workpiece alignment marks 108a/108b and/or the particle recesses 106a/106b may be based on a polar coordinate system, where each location is defined by an angle and an angular distance from a center point 401 of workpiece 108. For example, the location of the workpiece alignment mark 108b may be defined as being approximately 94.99 millimeters (mm) at a 55-degree angle 404 from the center point 401 of the workpiece 108.

In some embodiments, a backside alignment mark pin is located at the center point 401. The backside alignment mark pin may be able to move causing the backside alignment mark pin to move within a pin moving area. This movement can cause misalignment. However, here, the backside alignment mark pin can be removed avoiding misalignment caused by the backside alignment mark pin moving.

The alignment of the particle recesses 106a/106b with the workpiece alignment marks 108a/108b reduces alignment errors caused by a particle being trapped between the chuck 102 and the workpiece 108. In particular, absent the particle recesses 106a/106b, the closer a particle is to the workpiece alignment marks 108a/108b, the greater the misalignment between the workpiece alignment marks 108a/108b and the transfer alignment marks 110a/110b. Further, absent the particle recesses 106a/106b, a particle in close proximity to the workpiece alignment marks 108a/108b may lead to NCEs. The NCEs include errors that cannot be corrected by moving the workpiece 108 on the chuck 102 or by changing the magnification. For example, an NCE may be a vertical misalignment between the workpiece 108 on the chuck 102. By arranging the particle recesses 106a/106b proximate the workpiece alignment marks 108a/108b, the particle recesses 106a/106b trap particles in close proximity to the workpiece alignment marks 108a/108b so the particles don't affect alignment between the workpiece alignment marks 108a/108b and the transfer alignment marks 110a/110b. Therefore, NCEs are reduced. Reducing NCEs has the additional benefit of improving the focal range such that more features can be visualized on the workpiece 108 in a single focal plane. For example, the focal range can be improved from −0.45 to +0.55 to −0.45 to +0.65.

Additionally, by trapping the particle in one of the particle recesses 106a/106b, the workpiece 108 is able to be better seated on the chuck 102, thereby reducing the vertical misalignment of an NCE from, for example, 60 nm to 55 nm. In particular, suppose that the topography of the workpiece 108 is measured to determine errors in the Z (vertical) dimension of the Cartesian coordinate system to generate a Z map of the workpiece 108 as a part of a location quality test. The Z map is indicative of the overlay error as it illustrates dies 402 that are vertically misaligned, and thus, do not conform to the chuck 102. A chuck 102 having particle recesses 106a/106b improves the Z map of a corresponding workpiece because the particle recesses 106a/106b allow a particle to be sunken into the chuck 102 rather than pushing up on the workpiece 108 and creating an error in the Z dimension.

Figure 4B:
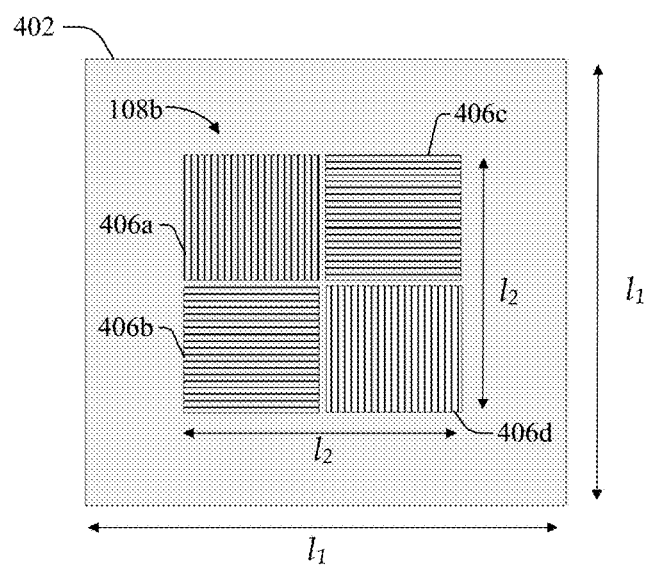
FIG. 4B illustrates a layout view of some embodiments of a workpiece alignment mark for use in the workpiece of FIG. 4A.

FIG. 4B illustrates an example workpiece alignment mark 108b for use in conjunction with a particle recess on a chuck (e.g., the chuck 102 of FIG. 1A). The workpiece alignment mark 108b may be a mark on a die, such as die 402, discussed above. The workpiece alignment mark 108b may not span the length, $l_1$, of the die 402, but instead inhabit a smaller region of the die 402. For example, the workpiece 108 may include a plurality of dies, like die 402, that have a length, $l_1$, in the x and y direction. The length, $l_1$, may be approximately 2 mm. The workpiece alignment mark 108b may be centered on the die 402 but have a shorter side length, $l_2$. In one embodiment, the shorter side length, $l_2$, may be approximately 0.413 mm.

While these examples are described with respect to the workpiece alignment mark 108b, the characteristics described may be present on any alignment mark used in conjunction with particle recesses (e.g., the particle recesses 106a/106b of FIG. 1A). In one embodiment, the workpiece alignment mark 108b may include a plurality of regions, such as regions 406a/406b/406c/406d. At least a subset of the regions may have different patterns in order to facilitate visualization and alignment of the workpiece alignment mark 108b with other alignment marks, such as the transfer alignment marks 100a/110b of FIG. 1A, or the particle recesses 106a/106b of FIG. 1A. In some embodiments, the workpiece alignment mark 108b may include an alignment structure to facilitate alignment. For example, the workpiece alignment mark 108b may have a three-dimensional feature.

Figure 4C:
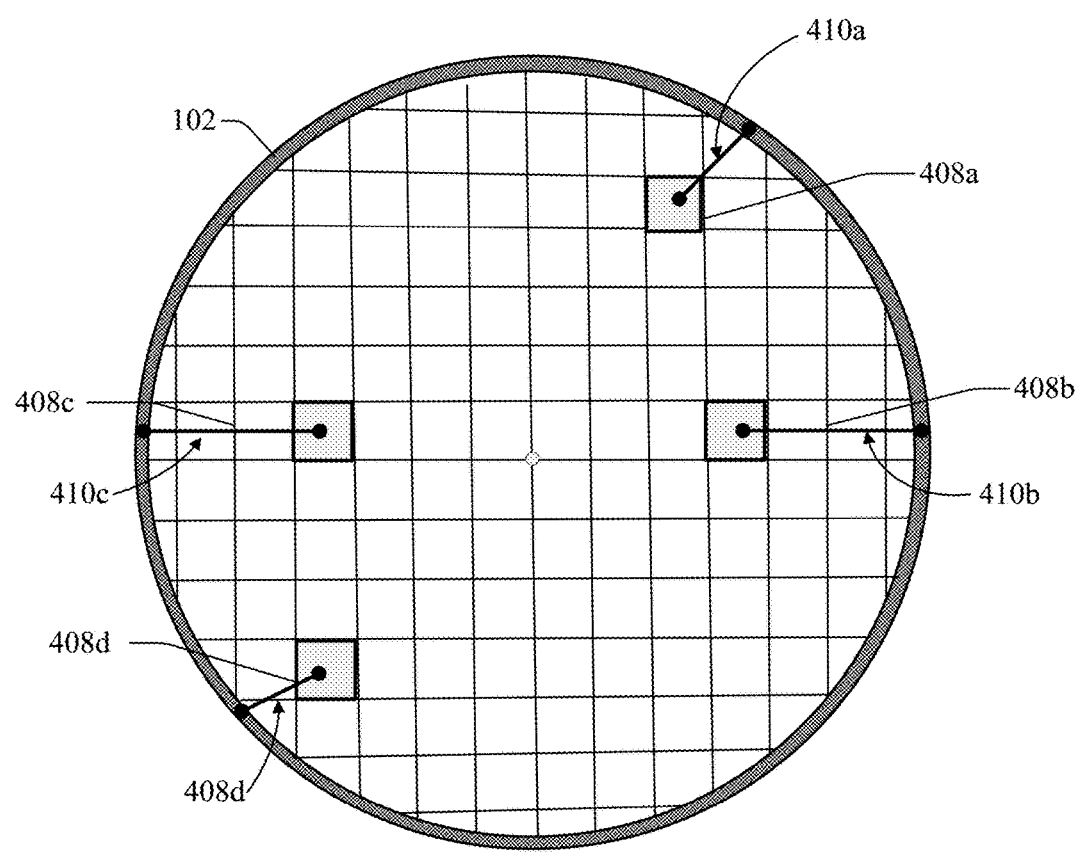
FIG. 4C illustrates a top view of other embodiments of a workpiece having dies and workpiece alignment marks.

FIG. 4C illustrates a top view of other embodiments of a workpiece having dies and workpiece alignment marks. While two alignment marks 108a/108b have been discussed, more or fewer may be used. Here, four alignment marks 408a, 408b, 408c, and 408d are shown. The alignment marks 408a, 408b, 408c, and 408d are arranged from the circumference of the die 402 by distances 410a, 410b, 410c, and 410d, respectively. In some embodiments, the distance 410a may be approximately 5 mm, the distance 410b may be approximately 15 mm, the distance 410c may be approximately 5 mm, and the distance 410d may be approximately 15 mm.

Figure 5:
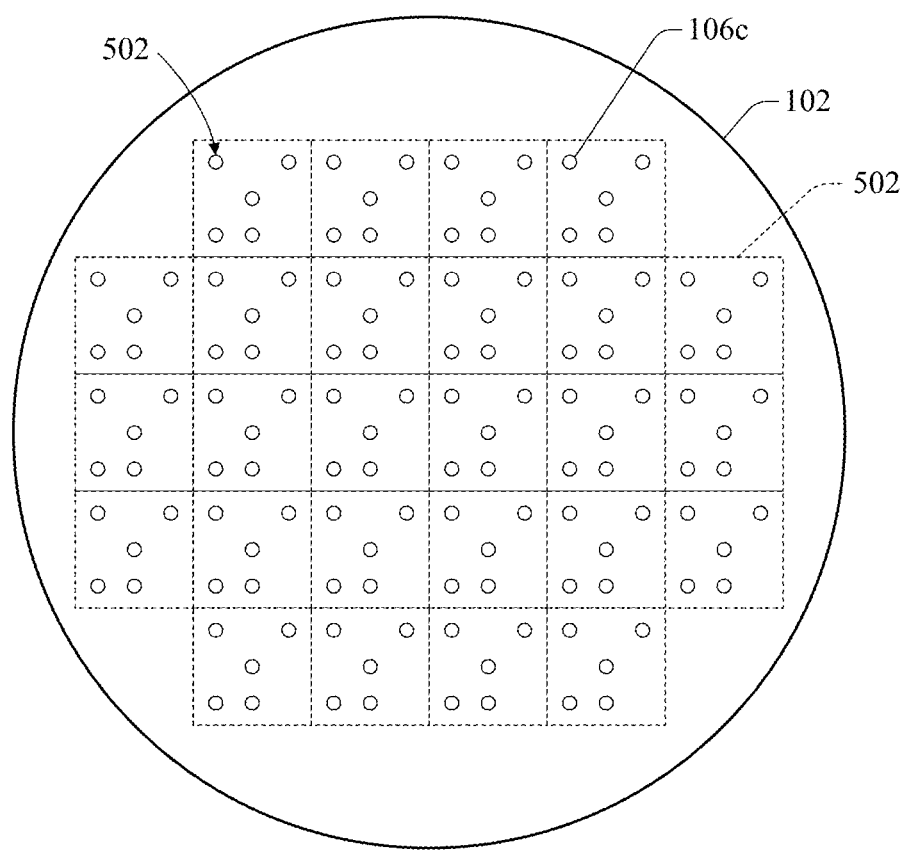
FIG. 5 illustrates a top view of some embodiments of the chuck of FIG. 1A in which the chuck has a repeating pattern of particle recesses.

FIG. 5 illustrates a top view of some embodiments of a chuck 102 of FIG. 1A having a repeating pattern of particle recesses 106c. Each of the particle recesses 106c is configured to underlie a workpiece alignment mark of a workpiece. The workpiece may be, for example, the workpiece of FIG. 4A. The chuck 102 has a plurality of like-sized die regions 502 arranged in a grid, and the repeating pattern repeats in each of the like-sized die regions 502. The grid may, for example, have multiple columns and/or multiple rows. Further, the like-sized die regions 502 may, for example, correspond to dies or exposure fields, such as the die 402 of FIG. 4A, and/or may, for example, be rectangular. While the repeating pattern is illustrated with 5 particle recesses in each die region 502, more or fewer particle recesses are amenable in other embodiments. Further, while the grid is illustrated with 26 like-sized die regions 502, more or fewer regions are amenable in other more. Further yet, while not shown, the chuck 102 may have impressions, such as the impressions 104 of FIG. 1A or FIG. 3.

FIGS. 6-11 illustrate a series of cross-sectional views 600-1100 of using a chuck 102 having particle recesses 106a/106b. The chuck 102 may, for example, be as described in FIGS. 1A and 1B.

Figure 6:
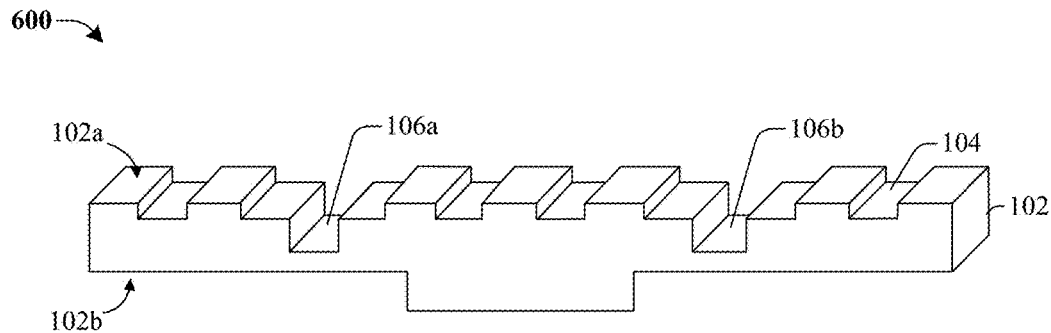
FIGS. 6-11 illustrate a series of cross-sectional views of some embodiments of a flow for using a chuck having particle recesses.

As shown in cross-sectional view 600 of FIG. 6, a chuck 102 is provided. The chuck 102 has a plurality of impressions 104 separated by protrusions of the chuck 102. The plurality of impressions 104 are bordered by protrusions of the chuck 102 that extend to the top surface 102a of the chuck 102. The chuck 102 also includes particle recesses 106a/106b that extend further into the chuck 102 than do the plurality of impressions 104. In some embodiments, the sidewalls of the particle recesses 106a/106b are shaped (e.g., sloped, curved, etc.) to cause a particle to move toward the particle recesses 106a/106b.

Figure 7:
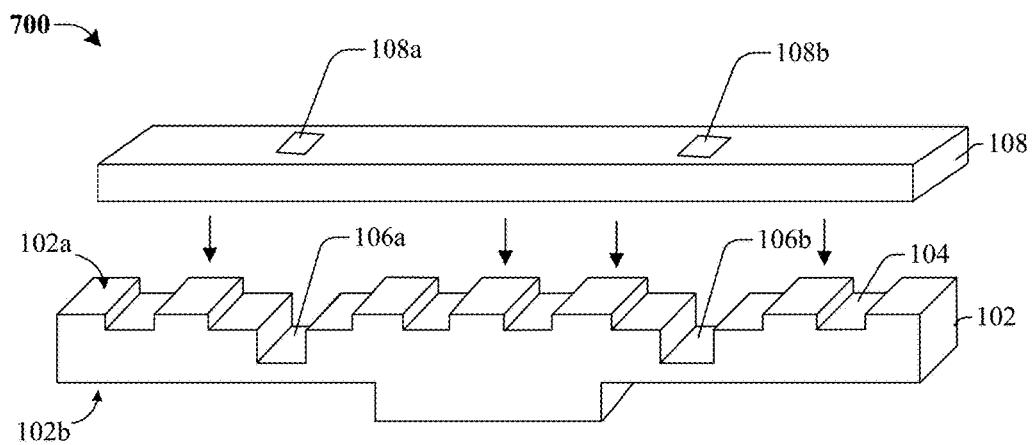

As shown in cross-sectional view 700 of FIG. 7, the chuck 102 receives a workpiece 108. The workpiece 108 is aligned with the chuck 102 based on the location of the workpiece alignment marks 108a/108b relative to the particle recesses 106a/106b of the chuck 102. For example, the workpiece 108 may be placed such that the workpiece alignment marks 108a/108b overlie the particle recesses 106a/106b. In some embodiments, the workpiece 108 is silicon. In other embodiments, the workpiece 108 is germanium, gallium arsenic, or other suitable semiconductor material.

Figure 8:
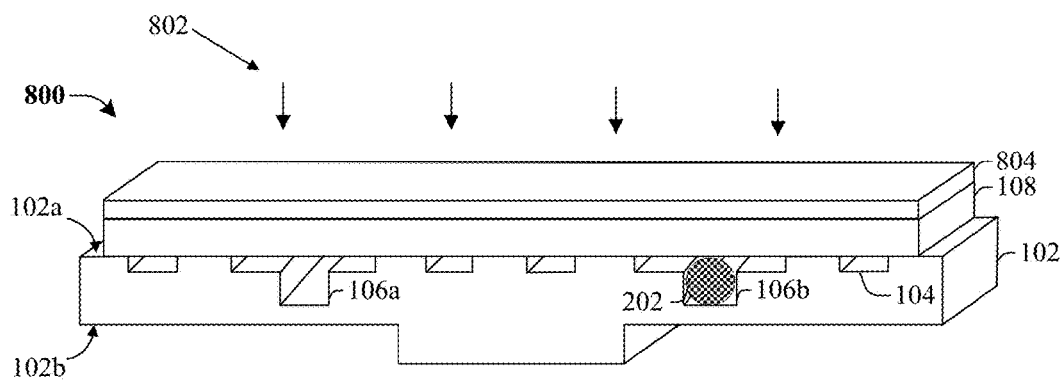

As shown in cross-sectional view 800 of FIG. 8, a photosensitive material 802 is applied to the workpiece 108 to define a photosensitive layer 504 on the workpiece 108. For example, the photosensitive material 802 may be a photoresist. While particles may be introduced between the chuck 102 and the workpiece 108 at any point during fabrication through contamination, coating the workpiece 108 with the photosensitive material 802 is one example of materials purposely being introduced during fabrication that may cause misalignment errors. In one embodiment, at this point in fabrication, particle 202 may become lodged between the workpiece 108 and the chuck 102. For example, the particle 202 may be from the photosensitive material 802.

Figure 9:
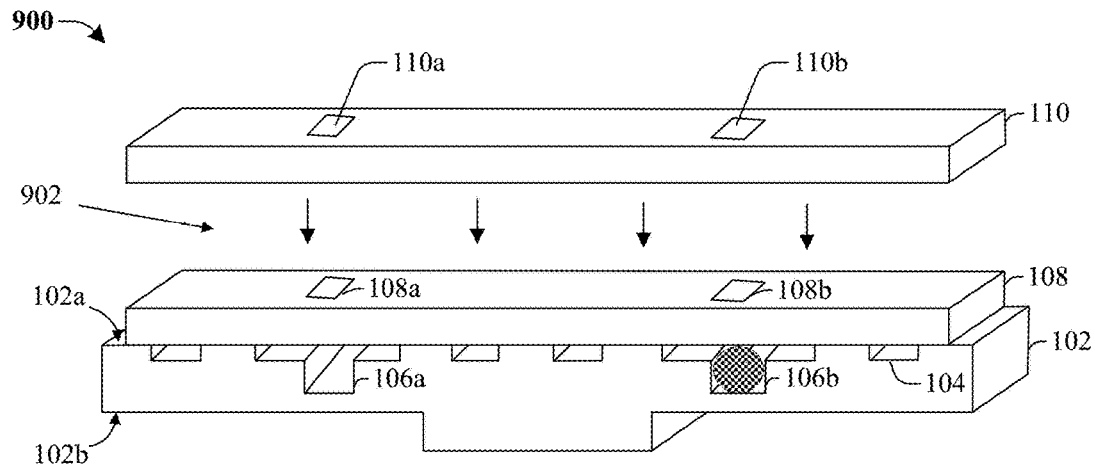
Figure 10:
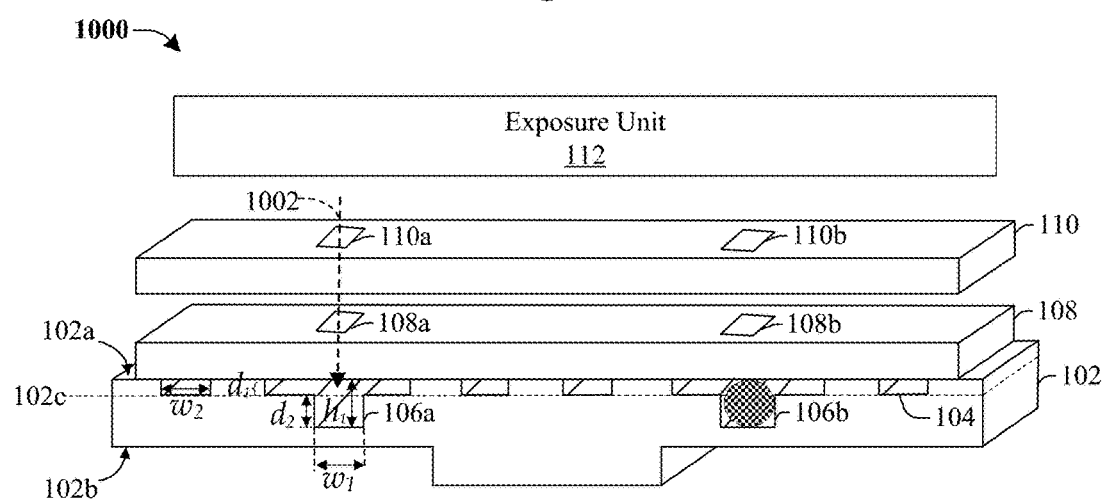

As shown in cross-sectional view 900 of FIG. 9, a transfer layer 110 is arranged over the workpiece 108. The transfer layer 110 is aligned with the workpiece 108 based on the location of the transfer alignment marks 110a/110b relative to the workpiece alignment marks 108a/108b. In some embodiments, the transfer layer 110 is a reticle As shown in cross-sectional view 1000 of FIG. 10, the workpiece 108 is exposed to radiation 1002 by the exposure unit 112, such as light, after the radiation 902 passes through the transfer layer 110. Passing the radiation 1002 through the transfer layer 110 patterns the radiation 1002 with a pattern of the transfer layer 110, such that the radiation 1002 transfers the pattern of the transfer layer to the photosensitive layer 804 (see FIG. 8). For ease of illustration, the photosensitive layer 804 is omitted from FIG. 10. To affect radiation over the entirety of the workpiece 108, the chuck 102 may move the workpiece 108 to ensure optimum exposure to the radiation 1002.

Figure 11:
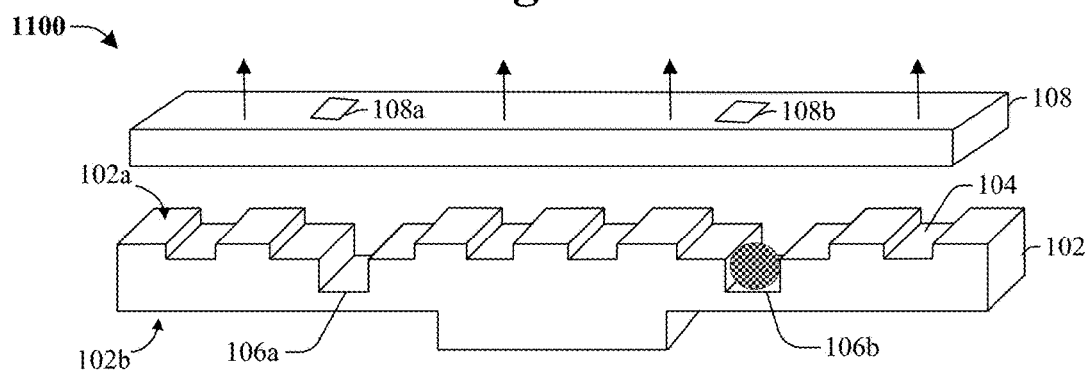

As shown in cross-sectional view 1100 of FIG. 11, the workpiece 108 is removed from the chuck 102 and the workpiece 108 is developed. The development causes the photosensitive layer 804 to dissolve in certain areas according to the amount of radiation received during exposure. For ease of illustration, the photosensitive layer 804 is omitted from FIG. 10. These areas of photosensitive material and no photosensitive material reproduce the pattern on the transfer layer 110.

Figure 12:
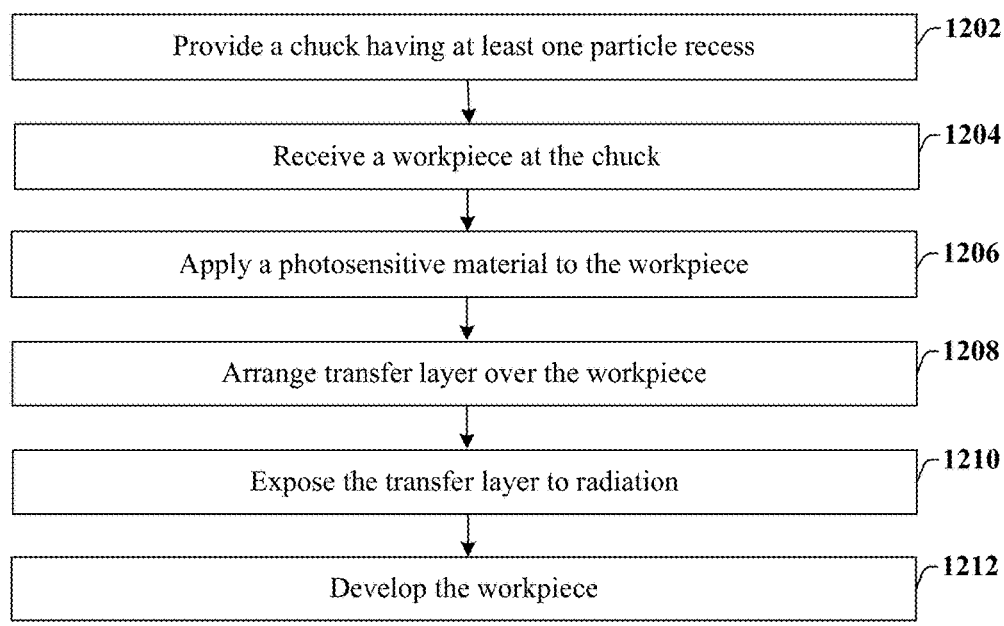
FIG. 12 illustrates a flow diagram of some embodiments of the flow of FIGS. 6-11.

With reference to FIG. 12, a flow diagram 1200 of semiconductor fabrication using a chuck having particle recesses according to some embodiments is illustrated.

At 1202, a chuck 102 is provided. See, for example, FIG. 5 and/or the chuck 102 in FIGS. 1A and 3. The chuck 102 can be a component of a wafer table/chuck assembly used for holding workpieces in place with a fixture that utilizes a vacuum chuck or some other means of mechanical, electrical, or magnetic attachment.

At 1204, the chuck 102 receives a workpiece 108. See, for example, FIG. 6 and/or the workpiece 108 in FIGS. 1A and 1B. The workpiece 108 may be secured to the chuck by virtue of a mechanical force (e.g., fastener) or an environmental force (e.g., vaccum).

At 1206, a photosensitive material 802 is applied to the workpiece 108. See, for example, FIG. 7. The photosensitive material 802 is a material having chemical properties that change when exposed to electromagnetic radiation (e.g., molecular chains of a photosensitive material may become cross-linked when exposed to electromagnetic radiation). In various embodiments, the photosensitive material 802 may comprise a photosensitive polymer such as a positive or negative photoresist. The photosensitive material 802 may be applied to the workpiece 108 using spin coating techniques, vapor deposition, etc.

At 1208, a transfer layer 110 is arranged over the workpiece 108. See, for example, FIG. 8 and/or the transfer layer 110 of FIG. 1A. The transfer layer 110 may be, for example, a reticle.

At 1210, the transfer layer 110 is exposed to electromagnetic radiation from an exposure unit 112. See, for example, FIG. 9 and/or the exposure unit 112 of FIG. 1A. In some embodiments, the exposure unit 112 may be configured to generate electromagnetic radiation within the deep ultraviolet region of the electromagnetic spectrum (e.g., approximately 193 nm). In such embodiments, the exposure unit 112 may comprise an excimer laser (e.g., comprising a krypton fluoride laser at approximately 248 nm wavelength or an argon fluoride laser at approximately 193 nm wavelength), for example. In other embodiments, exposure unit 112 may be configured to generate electromagnetic radiation within the extreme ultraviolet (EUV) region of the electromagnetic spectrum (e.g., approximately 13.5 nm). In yet other embodiments, the exposure unit 112 may be configured to generate electromagnetic radiation in other regions of the electromagnetic spectrum (e.g., radiation having wavelengths of approximately 248 nm, approximately 365 nm, and/or approximately 405 nm).

At 1212, the workpiece 108 coated by the photosensitive material 802 is developed. See, for example, FIG. 10. Developing the workpiece 108 may include transferring the workpiece 108 to another process tool and applying a chemical developer the photosensitive material 802. In some embodiments, the chemical developer removes regions of the photosensitive material 802 exposed to radiation. In other embodiments, the chemical developer may remove unexposed regions of the photosensitive material 802, while the exposed regions remain over the workpiece 108. In some embodiments, the chemical developer may comprise tetramethylammonium hydroxide (TMAH). In other embodiments, the chemical developer may comprise potassium hydroxide (KOH), sodium hydroxide (NaOH), acetate, ethyl lactate, or diacetone alcohol, for example.

While the block diagram 1200 of FIG. 12 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In view of the foregoing, some embodiments of the present application provide a chuck that includes a plurality of impressions and a particle recess. The impressions of the plurality of impressions are laterally spaced and extend in to the chuck from a top surface of the chuck to a base surface of the chuck. The base surface of the chuck defines bottom surfaces respectively of the impressions and is spaced between the top surface of the chuck and a bottom surface of the chuck. The particle recess extends in to the chuck from the top surface of the chuck to a location spaced between the base surface of the chuck and the bottom surface of the chuck. In particular, the particle recess is configured to underlie a workpiece alignment mark of a workpiece.

Further, other embodiments of the present application provide another embodiment of a wafer table having a chuck with particle recesses. The chuck has plurality of protrusions and a particle recess. The protrusions are laterally spaced and define a top surface of the chuck. The protrusions protrude from a base surface of the chuck to the top surface of the chuck. The base surface of the chuck is between the top surface of the chuck and a bottom surface of the chuck. The particle recess extends in to the chuck from the top surface of the chuck to a location between the bottom surface of the chuck and the base surface of the chuck.

Further yet, other embodiments of the present application provide a method for using a wafer table having a chuck with particle recesses. The method includes a chuck being provided. The chuck has a plurality of impressions and a particle recess. The impressions of the plurality of impressions are laterally spaced and extend into the chuck from a top surface of the chuck to a base surface of the chuck. The base surface of the chuck defines bottom surfaces respectively of the impressions, and is spaced between the top surface of the chuck and a bottom surface of the chuck. The particle recess extends in to the chuck from the top surface of the chuck to a location spaced between the base surface of the chuck and the bottom surface of the chuck. A workpiece is then positioned on the chuck. The workpiece has a workpiece alignment mark. The workpiece is positioned so the workpiece alignment mark overlaps with the particle recess. The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer table comprising:
   a chuck having a plurality of impressions and a pair of particle recesses, wherein the impressions are laterally spaced and extend in to the chuck from a top surface of the chuck to a base surface of the chuck, wherein the base surface of the chuck defines bottom surfaces respectively of the impressions, and is spaced between the top surface of the chuck and a bottom surface of the chuck, wherein the particle recesses are localized respectively to opposite sides of the chuck and are cuboid or cylinder shaped, wherein the particle recesses extend in to the chuck from the top surface of the chuck to individual particle-recess surfaces of the chuck that are spaced between the base surface of the chuck and the bottom surface of the chuck, and wherein the particle recesses are configured to underlie individual workpiece alignment marks of a workpiece.

2. The wafer table of claim 1, wherein the impressions are circular.

3. The wafer table of claim 1, wherein the impressions are concentric, ring-shaped trenches positioned about a center point on the chuck.

4. The wafer table of claim 1, wherein the particle recesses are open at only the top surface of the chuck.

5. The wafer table of claim 1, wherein the chuck comprises a plurality of die regions in a plurality of columns and a plurality of rows, wherein the die regions each comprise a plurality of particle recesses in a pattern, and wherein the pattern is the same for all of the die regions.

6. The wafer table of claim 1, wherein the pair of particle recesses comprise a first particle recess, wherein the first particle recess is between and open to two impressions of the plurality of impressions, such that the first particle recess and the two impressions collectively define an opening with a stepped profile.

7. The wafer table of claim 1, wherein the pair of particle recesses comprise a first particle recess, wherein the first particle recess is symmetric about a centerline and is between two impressions of the plurality of impressions, wherein the first particle recess has recess sidewalls and the two impressions have impression sidewalls, and wherein the recess sidewalls are positioned more closely to the centerline than the impression sidewalls.

8. The wafer table of claim 1, further comprising the workpiece on the chuck, wherein the workpiece alignment marks respectively and directly overlap with the particle recesses.

9. A process tool comprising:
   a chuck having a plurality of first protrusions, a plurality of second protrusions, a third protrusion, and a plurality of particle recesses, wherein the first, second, and third protrusions are laterally spaced from and independent of each other, wherein the first, second, and third protrusions define a top surface of the chuck and protrude from a base surface of the chuck to the top surface of the chuck, wherein the base surface of the chuck is between the top surface of the chuck and a bottom surface of the chuck, wherein the particle recesses extend in to the chuck from the top surface of the chuck to a location between the bottom surface of the chuck and the base surface of the chuck, wherein the first protrusions each extend continuously in a first closed path around a center of the chuck, wherein the second protrusions each extend continuously in a second closed path around the plurality of first protrusions except at the particle recesses, and wherein the third protrusion extends continuously in a third closed path around the plurality of second protrusions.

10. The process tool of claim 9, wherein the first, second, and third protrusions are ring-shaped and concentrically aligned about the center of the chuck.

11. The process tool of claim 9, further comprising:
a reticle overlapping the chuck and having a plurality of reticle alignment marks, wherein the reticle alignment marks respectively and directly overlie the particle recesses; and
an exposure unit configured to emit radiation towards the chuck, through the reticle.

12. The process tool of claim 11, further comprising:
a workpiece on the chuck; and
a plurality of wafer alignment marks in the workpiece, wherein the wafer alignment marks respectively and directly overlie the particle recesses.

13. The process tool of claim 9, wherein the particle recesses are cuboid shaped or cylinder shaped, wherein the particle recesses have individual topmost boundaries at the top surface of the chuck, and further have individual bottommost boundaries at the location, and wherein the particle recesses are open at only the top surface of the chuck.

14. The process tool according to claim 9, wherein the plurality of particle recesses consists of two particle recesses, and wherein the two particle recesses are on opposite sides of the chuck.

15. The process tool of claim 9, wherein the plurality of particle recesses comprises a first particle recess, wherein the plurality of second protrusions comprises a second protrusion, wherein the second protrusion has a first end and a second end, wherein the first and second ends are on opposite sides of the first particle recess, and wherein a sidewall of the chuck is in the first particle recess and arcs continuously from the first end to the second end.

16. A method, comprising:
providing a chuck having a plurality of impressions and a particle recess, wherein the impressions are laterally spaced and extend into the chuck from a top surface of the chuck to a base surface of the chuck, wherein the base surface of the chuck defines bottom surfaces respectively of the impressions, and is spaced between the top surface of the chuck and a bottom surface of the chuck, and wherein the particle recess extends in to the chuck from the top surface of the chuck to a location spaced between the base surface of the chuck and the bottom surface of the chuck; and
positioning a workpiece on the chuck, wherein the workpiece has a workpiece alignment mark within the workpiece, and wherein the workpiece is positioned so the workpiece alignment mark directly overlaps with the particle recess.

17. The method of claim 16, further comprising:
forming a photosensitive layer on the workpiece, wherein a particle of the photosensitive layer becomes trapped in the particle recess;
selectively exposing the photosensitive layer to electromagnetic radiation using a reticle; and
developing the photosensitive layer.

18. The method of claim 17, further comprising:
positioning the reticle on the chuck, wherein the reticle has a reticle alignment mark within the reticle, and wherein the reticle is positioned so the reticle alignment mark directly overlaps with the particle recess.

19. The method of claim 18, wherein the reticle is positioned so the reticle alignment mark directly overlies the workpiece alignment mark.

20. The method of claim 16, wherein the chuck has a second particle recess on an opposite side of the chuck as the particle recess, wherein the second particle recess extends in to the chuck from the top surface of the chuck to a second location spaced between the base surface of the chuck and the bottom surface of the chuck, wherein the workpiece has a second workpiece alignment mark within the workpiece, and wherein the workpiece is positioned so the second workpiece alignment mark directly overlies the second particle recess.

* * * * *